(12) United States Patent
Ogata et al.

(10) Patent No.: US 8,159,674 B2
(45) Date of Patent: Apr. 17, 2012

(54) EXPOSURE METHOD AND EXPOSURE DEVICE

(75) Inventors: Shouichi Ogata, Sakai (JP); Daisuke Fuse, Sakai (JP); Yasuo Minami, Kamayama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/137,949

(22) Filed: Sep. 22, 2011

(65) Prior Publication Data
US 2012/0013788 A1    Jan. 19, 2012

Related U.S. Application Data

(63) Continuation of application No. 12/295,925, filed as application No. PCT/JP2006/324541 on Dec. 8, 2006, now Pat. No. 8,055,099.

(30) Foreign Application Priority Data

Apr. 5, 2006 (JP) .............. JP2006-104161

(51) Int. Cl.
*G01B 11/00* (2006.01)
*G03B 27/52* (2006.01)
(52) U.S. Cl. ............ 356/399; 356/400; 355/53; 355/55
(58) Field of Classification Search .......... 356/399–401; 355/53, 55
See application file for complete search history.

(56) References Cited

U.S. PATENT DOCUMENTS

| 5,773,180 A | 6/1998 | Tomimatu |
| 6,512,564 B1 | 1/2003 | Yoshida et al. |
| 6,549,269 B1 * | 4/2003 | Nishi et al. ............ 355/53 |
| 6,985,209 B2 | 1/2006 | Yoshida |
| 2004/0090607 A1 | 5/2004 | Yoshida |

FOREIGN PATENT DOCUMENTS

| JP | 2004-246025 A | 9/2004 |
| JP | 2004-272139 A | 9/2004 |
| JP | 2005-24649 A | 1/2005 |
| JP | 2005-316166 A | 11/2005 |

OTHER PUBLICATIONS

Notice of Allowance mailed Aug. 4, 2011 in U.S. Appl. No. 12/295,925.
International Search Report for PCT/JP2006/324541, mailed Mar. 6, 2007.
Japanese Office Action and English translation thereof mailed Mar. 8, 2011 in Japanese application 2008-508452.

* cited by examiner

*Primary Examiner* — Layla Lauchman
(74) *Attorney, Agent, or Firm* — Nixon & Vanderhye, P.C.

(57) ABSTRACT

An exposure method capable of performing accurate exposure without using a large photomask. The exposure method performs exposure while relatively moving a photomask above a substrate and includes a step of performing position correction of the photomask by performing, on a front side of the photomask relatively moved in a moving direction, image recognition of a pattern prearranged on the substrate such as a line and a black matrix and by correcting deviation of the photomask with respect to the pattern, and a step of checking the position correction of the photomask by performing image recognition of a reference mark arranged on the photomask and by determining whether or not the position correction of the photomask is accurately performed in the step of performing the position correction of the photomask.

12 Claims, 6 Drawing Sheets

EXPOSURE METHOD AND EXPOSURE DEVICE

This application is a continuation of U.S. patent application Ser. No. 12/295,925 filed May 20, 2009, now U.S. Pat. No. 8,055,099, which is the U.S. national phase of International Application No. PCT/JP2006/324541, filed 8 Dec. 2006, which designated the U.S. and claims priority to Japan Application No. 2006-104161, filed 5 Apr. 2006, the entire contents of each of which are hereby incorporated by reference.

BACKGROUND OF THE INVENTION

1. Field of the Invention

The present invention relates to an exposure method and an exposure device, and in particular relates to an exposure method and an exposure device which perform exposure while relatively moving a substrate and a photomask.

2. Description of the Related Art

In a liquid crystal display panel, a pair of substrates are arranged opposing to each other at a predetermined gap, and liquid crystals are filled therebetween. On one of the substrates, constituents are stacked such as pixel electrodes which apply voltage to the liquid crystals, switching elements such as thin film transistors which drive the pixel electrodes, various lines such as gate bus lines and source bus lines, and an alignment layer which provides a pretilt angle to the liquid crystals. On the other substrate, constituents are stacked such as a black matrix, color filter layers having predetermined colors, common electrodes, and an alignment layer.

An alignment process for aligning the liquid crystals toward a predetermined direction is applied to the alignment layers arranged on the substrates. Conventionally, a rubbing process using a material such as a textile material is used as the alignment process. However, a photoalignment process has recently been used alternatively as the alignment process. The photoalignment process is a process that provides predetermined alignment characteristics on a surface of an alignment layer through a step to project light energy onto the surface of the alignment layer at a predetermined incident angle.

Constituents such as the switching element, the various lines, the black matrix, and the color filter layers are arranged using a photolithographic process. For example, the color filter layer is formed through a step to coat the substrate surface with a photoresist material having a predetermined color, a step to project light energy onto a predetermined pattern region on the photoresist material using a photomask, and a step to remove an unnecessary portion of the photoresist material (e.g. a portion onto which the light energy is not projected).

As prior art literatures relating to the present invention, Japanese Patent Application Unexamined Publications Nos. 2005-024649 and Hei11-133429 are cited.

An exposure step to project light energy onto a predetermined region on a surface of a substrate is indispensable in manufacturing of liquid crystal display panels. If deviation in an exposure position and/or an exposure range occurs, conditions such as of alignment of liquid crystals and of lines arranged on the substrate may become different from the designed conditions, causing the substrate to fail to have designed alignment or characteristics. For example, if deviation in a position and/or a range of light energy projection Occurs in the exposure step to provide the photoalignment process to the alignment layer, it becomes impossible to provide the designed pretilt angle to the liquid crystals.

In addition, when projecting light energy onto the surface to be irradiated of the substrate using a photomask, the accuracy regarding the position and/or the range of light energy projection is significantly influenced by the dimensional accuracy of a pattern of light shielding portions and light transmitting portions which are arranged on the photomask, thereby rendering the photomask to be expensive. Moreover, the size of photomasks has been increased along with recent upsizing of substrates, resulting in even more expensive photomasks.

Further, when a large photomask is used, problems tend to occur such as change in the sizes of light shielding portions and light transmitting portions and deviation in alignment with the substrate, due to factors such as deformation and thermal expansion. Countermeasures against the problems are performed for example by suppressing the change in the sizes by managing the temperatures of the substrate and the photomask and by improving the accuracy of the mechanism for alignment and the control thereof, but such countermeasures result in complicated processes and increased running costs. Hence, the present invention aims to provide an exposure method and an exposure device capable of performing accurate exposure without using a large photomask.

SUMMARY OF THE INVENTION

An object of the invention is to overcome the problems described above and to provide a method for performing exposure by projecting ultraviolet light or other light onto some regions on a surface of a substrate using a plurality of small photomasks having slit openings while moving the substrate. This method enables predetermined regions on the substrate surface to be exposed in stripes (i.e. irradiated with ultraviolet light or other light). In addition, while projecting ultraviolet light or other light and moving the substrate, this method simultaneously photographs existing patterns prearranged on the substrate surface, for example, line patterns including gate bus lines, source bus lines, and a black matrix, and a reference mark arranged on the photomask, in order to monitor the position onto which the light is actually projected, that is, the position of the photomask with respect to the existing patterns using a photographed image. By such exposure method, it is possible to perform exposure with high alignment accuracy regardless of the sizes of substrates.

Preferred embodiments of the present invention provides an exposure method which performs exposure while relatively moving a photomask above a substrate and includes a step of performing position correction of a photomask by performing, on a front side of the photomask relatively moved in a moving direction, image recognition of a pattern prearranged on the substrate and by correcting deviation of the photomask with respect to the pattern, and a step of checking the position correction of the photomask by performing image recognition of a reference mark arranged on the photomask and by determining whether or not the position correction of the photomask is accurately performed in the step of performing the position correction of the photomask.

It is preferable that a light transmitting window for performing the image recognition of the pattern prearranged on the substrate is arranged on the photomask and the reference mark of the photomask is arranged on the light transmitting window.

In addition, it is also preferable that the image recognition of the pattern prearranged on the substrate and the image recognition of the reference mark of the photomask are performed using one camera, and it is further preferable if the camera is a bifocal camera.

Preferred embodiments of the present invention also provide an exposure device which performs exposure while relatively moving a photomask above a substrate and includes a mechanism to perform position correction of the photomask by performing, on a front side of the photomask relatively moved in a moving direction, image recognition of a pattern prearranged on the substrate and by correcting deviation of the photomask with respect to the pattern, and a mechanism to check the position correction of the photomask by performing image recognition of a reference mark arranged on the photomask and by determining whether or not the position correction of the photomask is accurately performed by the mechanism to perform the position correction of the photomask.

It is preferable that a light transmitting window for performing the image recognition of the pattern prearranged on the substrate is arranged on the photomask and the reference mark of the photomask is arranged on the light transmitting window.

In addition, it is also preferable that the image recognition of the pattern prearranged on the substrate and the image recognition of the reference mark of the photomask are performed using one camera, and it is further preferable if the camera is a bifocal camera.

The present invention allows to perform exposure with high alignment accuracy when the exposure is performed while the photomask is relatively moved above the substrate, because the exposure method and the exposure device according to the preferred embodiments of the present invention include the position correction of the photomask in which the image recognition of the pattern prearranged on the front side of the photomask relatively moved in the moving direction and any deviation of the photomask with respect to the pattern is corrected, and the checking of the position correction of the photomask, in which the image recognition of the reference mark arranged on the photomask is performed and it is determined whether or not the position correction of the photomask is accurately performed by the above-described position correction of the photomask.

If the photomask is configured such that the light transmitting window for performing the image recognition of the pattern prearranged on the substrate is arranged on the photomask and the reference mark of the photomask is arranged on the light transmitting window, the light transmitting window and the reference mark can be provided in a normal manufacturing process of the photomask. Accordingly, the cost to manufacture the photomask does not increase.

In addition, if the image recognition of the pattern prearranged on the substrate and the image recognition of the reference mark of the photomask are performed using one camera, it becomes possible to simplify equipment for the image recognition, and the positioning accuracy of the camera is improved as compared to the case of providing two cameras for both of the image recognitions.

Further, if the camera is a bifocal camera, it is possible to simultaneously perform focus adjustment in the image recognition of the pattern prearranged on the substrate and focus adjustment in the image recognition of the reference mark of the photomask. Thus, recognized images are not blurred, thereby allowing easier image processing such as detection of edges.

BRIEF DESCRIPTION OF THE DRAWINGS

FIG. 1A is an overhead view of the exposure device seen from above a surface to be irradiated of a substrate, while FIG. 1B is a side view of the exposure device.

FIG. 4A illustrates a photoalignment process on an array substrate, FIG. 4B illustrates a photoalignment process on a color filter substrate.

DETAILED DESCRIPTION OF PREFERRED EMBODIMENTS

Figure 1A:
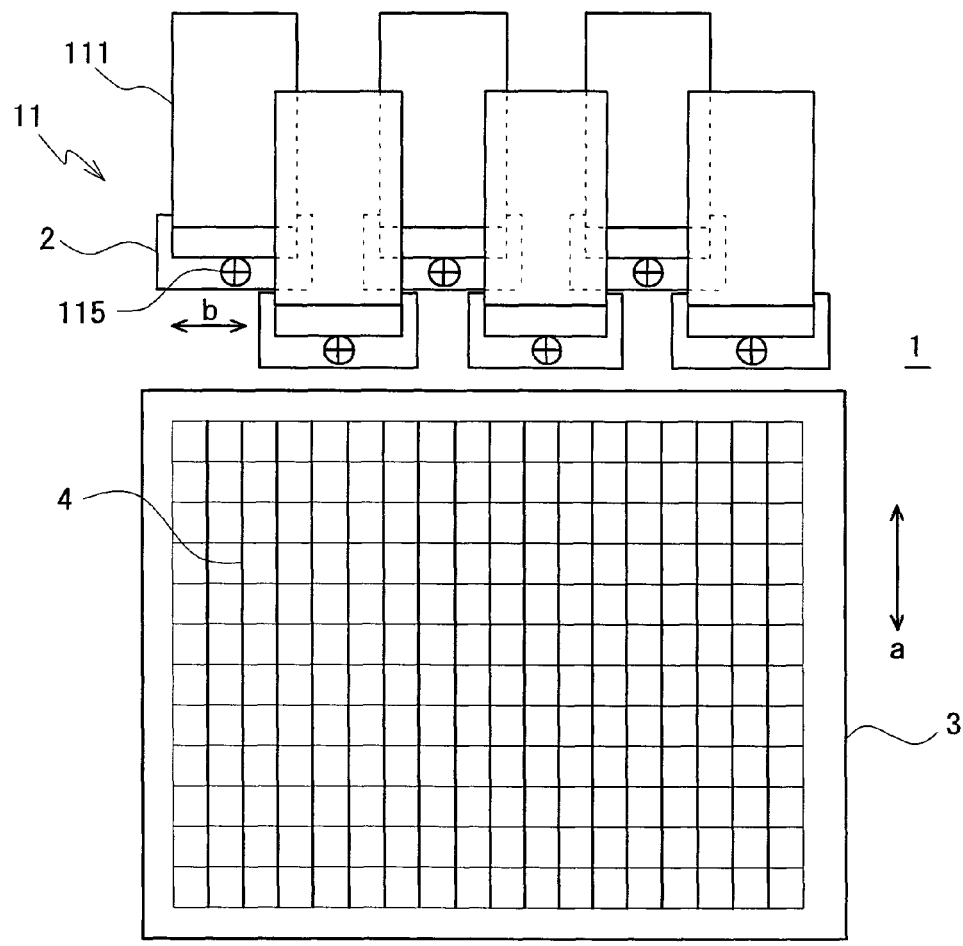
FIGS. 1A and 1B are schematic views illustrating a configuration of major portions of an exposure device according to a preferred embodiment of the present invention.
Figure 1B:
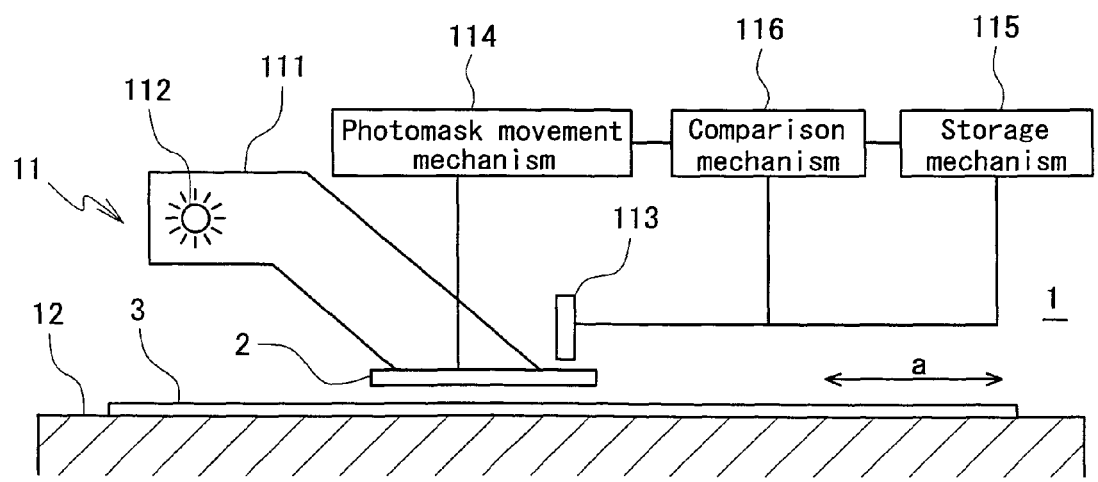

A detailed description of preferred embodiments of the present invention will now be given with reference to the accompanying drawings. FIGS. 1A and 1B are schematic views illustrating a configuration of major portions of an exposure device according to a preferred embodiment of the present invention, and FIG. 1A is an overhead view of the exposure device seen from above a surface to be irradiated of a substrate, while FIG. 1B is a side view of the exposure device.

An exposure device 1 includes a plurality of exposure units 11 which project light energy onto a surface to be irradiated of a substrate 3, and a table 12 which supports and moves the substrate 3. Arrows a in FIGS. 1A and 1B indicate the moving direction of the substrate 3 on the table 12.

Each of the exposure units 11 has an exposure head 111, a light source 112, a photomask 2, a camera 113, a photomask movement mechanism 114, a storage mechanism 115, and a comparison mechanism 116. By arranging a plurality of the exposure units 11 in a zigzag configuration in a direction perpendicular to the moving direction a of the substrate 3 as illustrated in FIG. 1A, the whole surface to be irradiated of the substrate 3 can be exposed.

As the light source 112 of the exposure unit 11, various known light sources may be used which can emit light energy in a predetermined wavelength band, and a suitable light source is selected according to circumstances such as a purpose of irradiation and the type of an object to be irradiated. For example, an ultraviolet light source is used when projecting ultraviolet light onto the surface to be irradiated of the substrate 3.

The photomask 2 which is used for exposure is arranged such that the surface thereof is substantially parallel to the surface to be irradiated of the substrate 3 as an ordinary state. In addition, the photomask 2 is hold such that it is located below the exposure head 111 and movable on a plane, which is parallel to the surface to be irradiated of the substrate 3, to a direction b which is perpendicular to the moving direction a of the substrate 3.

Figure 2:
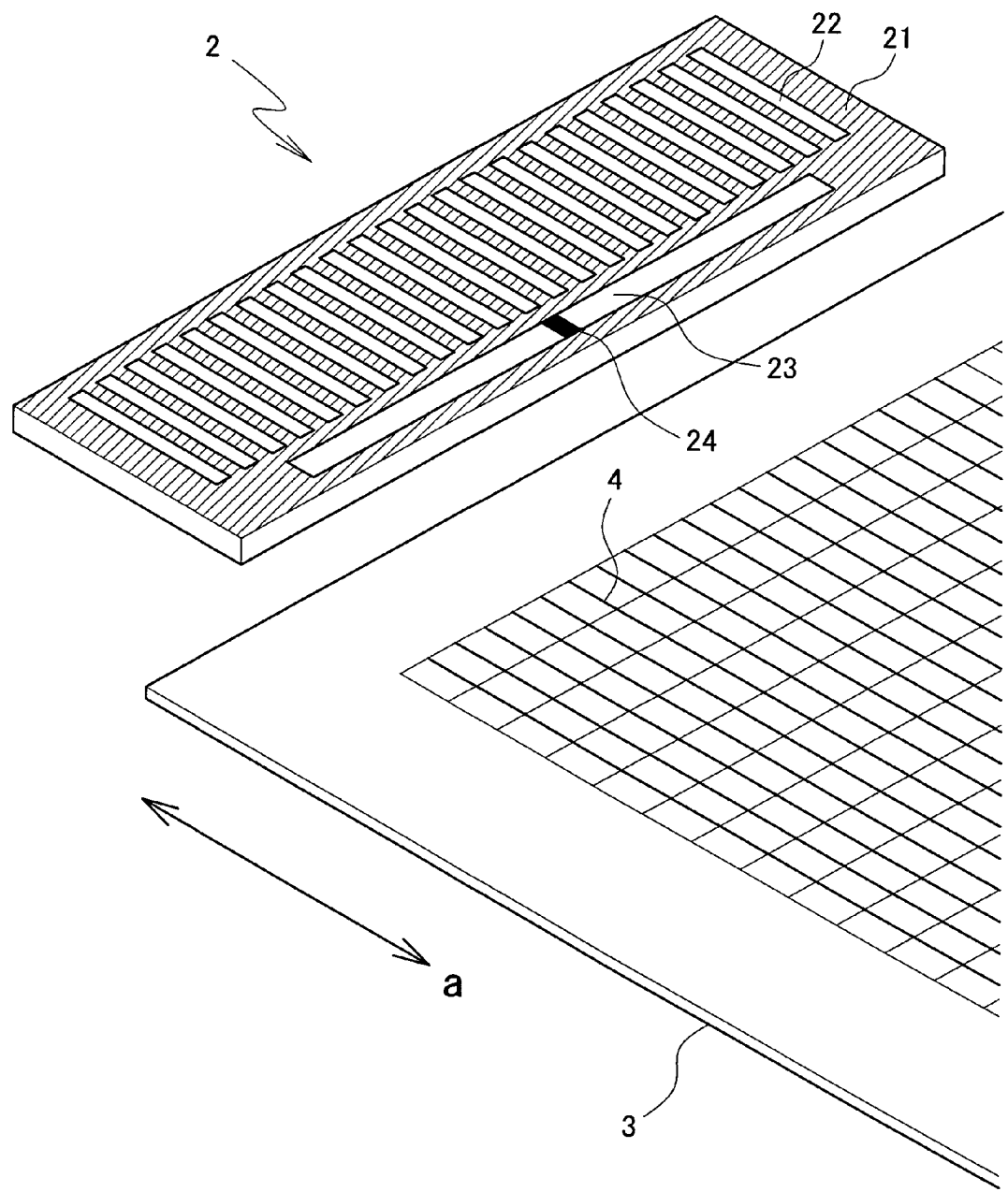
FIG. 2 is an external perspective view schematically illustrating a configuration of a photomask used in the exposure device illustrated in FIGS. 1A and 1B.

The photomask 2 is a transparent substrate made of silica glass or other material on which light transmitting portions and light shielding portions are arranged in a predetermined pattern. FIG. 2 is an external perspective view schematically illustrating a configuration example of the photomask 2. An arrow a in FIG. 2 indicates the moving direction of the substrate 3. On the photomask 2, vertically long slits defining the light transmitting members 22 are arranged side by side with a predetermined pitch along a direction perpendicular to the moving direction a of the substrate 3. In FIG. 2, a region on which hatching is applied is the light shielding portions 21 while regions on which hatching is not applied are the light transmitting portions 22.

A horizontally long slit defining a light transmitting window 23 is arranged on the photomask 2 on a front side of the photomask 2 moved relative to the substrate 3 in a moving direction, and a reference mark 24 defining an alignment mark of the photomask 2 is arranged on the light transmitting window 23.

The camera 113 is capable of photographing the surface to be irradiated of the substrate 3 which is placed on the table 12. A known photographing device such as a CCD camera may be used as the camera 113. As illustrated in FIG. 1B, the camera 113 is arranged on the exposure head 111 on a front side of the exposure head 111 moved relative to the substrate 3 in a moving direction.

The camera 113 photographs an existing pattern 4 including a gate bus line, a source bus line, and a black matrix, which is prearranged on the substrate 3. Here, the camera 113 photographs the existing pattern 4 in order to perform image recognition of a line from the starting edge to the ending edge of the existing pattern 4 which is arranged in parallel to the moving direction a of the substrate 3 (which is illustrated as a vertical line in FIG. 1A). Accordingly, the image recognition of the existing pattern 4 moving under the light transmitting window 23 is performed by photographing the existing pattern 4 using the camera 113.

In case the existing pattern 4 moving under the light transmitting window 23 deviates toward a direction perpendicular to the moving direction a of the substrate 3 while the camera 113 photographs the existing pattern 4, an amount of the deviation is calculated and the photomask 2 is moved for alignment adjustment according the deviation amount. The alignment adjustment is performed by the above movement control of the photomask 2 following the existing pattern 4, thereby allowing accurate exposure of a position along the existing pattern 4.

In addition to photographing the existing pattern 4 moving under the light transmitting window 23, the camera 113 simultaneously photographs the reference mark 24 arranged on the light transmitting window 23. When the photomask 2 is moved to correct the deviation while the camera 113 photographs the existing pattern 4 as described above, the reference mark 24 being photographed also moves. At this time, an amount of the movement of the reference mark 24 is calculated, and it is determined whether or not the movement of the photomask 2 for alignment adjustment has been accurately performed. If the determination result indicates that the photomask has not moved, or the movement amount is considerably greater than the calculated deviation amount, an action such as stopping of the exposure process is performed.

Each of the photomasks 2 is provided with the camera 113. Additionally, each of the cameras 113 is made independently movable by a movement mechanism (not shown) which differs from the movement mechanism used to move the photomask 2. The movement mechanism for the camera 113 is used for purposes such as alignment with the photomask 2 performed before starting exposure.

Figure 3:
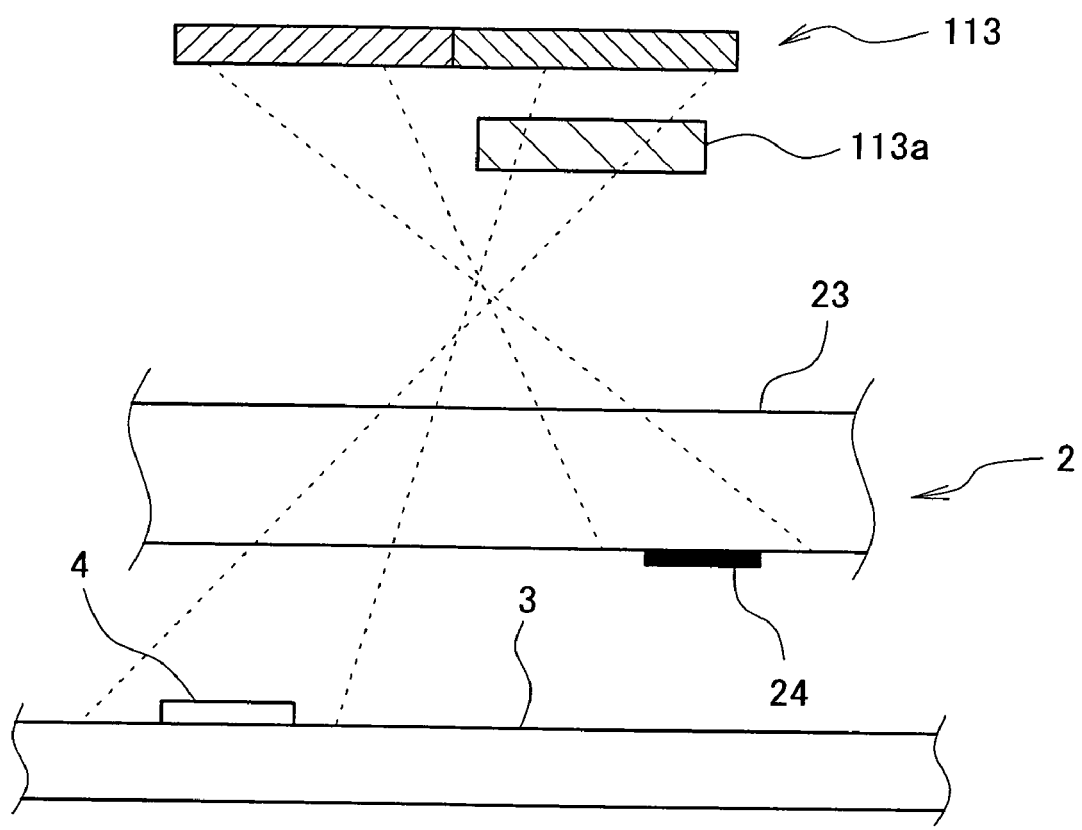
FIG. 3 is a view schematically illustrating the bifocal configuration of a camera used in the exposure device illustrated in FIGS. 1A and 1B.

The camera 113 is a bifocal camera having two focal points as illustrated in FIG. 3 which is capable of focusing on each of the existing pattern 4 on the substrate 3 and the reference mark 24 and clearly photographing both of them. As illustrated in FIG. 3, a light adjustment plate 113a is interposed between a half of the view field of the camera 113 and the photomask 2 so as to simultaneously focus on the existing pattern 4 on the substrate 3 and the reference mark 24 of the photomask 2 which have different focal depths.

The storage mechanism 115 stores a reference image used to align the photomask 2 and is capable of further storing an image of the existing pattern 4 and an image of the reference mark 24 of the photomask 2 which are photographed by the camera 113.

The comparison mechanism 116 compares the image of the existing pattern 4 on the substrate 3 which is photographed by the camera 113 and the reference image stored in the storage mechanism 115 and determines positional relation between a region of the surface to be irradiated of the substrate 3 onto which the light energy is actually projected and a region onto which the light energy is designed to be projected, in other words, determines an amount of positional deviation of the photomask 2 with respect to the existing pattern 4.

The photomask movement mechanism 114 corrects the deviation by moving the position of the photomask 2 based on the deviation amount determined by the comparison mechanism 116 so that the light energy is actually projected onto the region of the surface to be irradiated of the substrate 3 onto which the light energy is designed to be projected.

In addition, the comparison mechanism 116 compares an image of the reference mark 24 of the photomask 2 photographed by the camera 113 before the position of the photomask 2 is corrected by the mask movement mechanism 114 and an image of the reference mark 24 of the photomask 2 photographed by the camera 113 after the position of the photomask 2 is corrected, determines an amount of the movement of the photomask 2 which has been performed to correct the position, and determines whether or not the correction of the position of the photomask 2 is accurately performed. If the determination result indicates that the photomask has not moved, or the movement amount is considerably greater than the calculated deviation amount, an action such as stopping of the exposure process is performed. If the movement amount of the photomask 2 is equal to the determined deviation amount, the exposure process continues.

The light energy is projected onto the substrate 3 while moving the substrate 3, and the alignment adjustment of the photomask 2 is performed following the existing pattern 4 as described above. Then, the exposure process terminates when the existing pattern 4 moves under the photomask 2 from the starting edge to the ending edge.

By using the image of the existing pattern and the image of the reference mark 24 of the photomask 2 photographed by the camera 113, positional relation between the existing pattern 4 and the photomask 2 is monitored during exposure. Accordingly, it is possible to significantly improve the accuracy of the alignment of the photomask 2 with respect to the existing pattern 4.

Next, an implementation example according to the preferred embodiment of the present invention is described. The implementation example described herein is a photoalignment process which is applied to an alignment layer to form a plurality of regions having different alignments of liquid crystals (hereinafter referred to as domain regions) in each pixel of a liquid crystal display panel. In this implementation example, ultraviolet light is used as light energy to be projected.

Figure 4A:
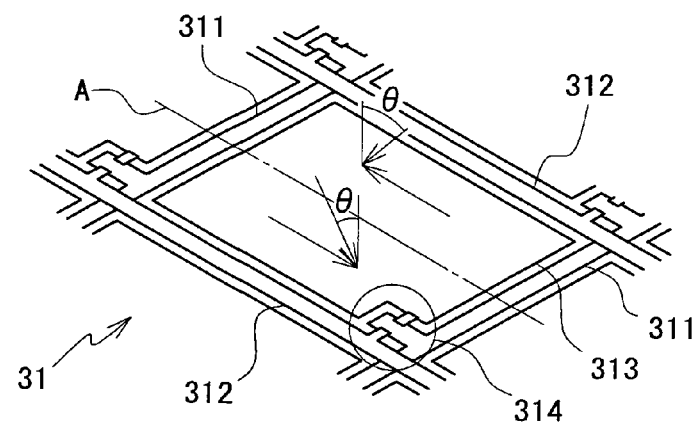
FIGS. 4A and 4B are schematic views illustrating a photoalignment process of an exposure method or the exposure device according to preferred embodiments of the present invention.
Figure 4B:
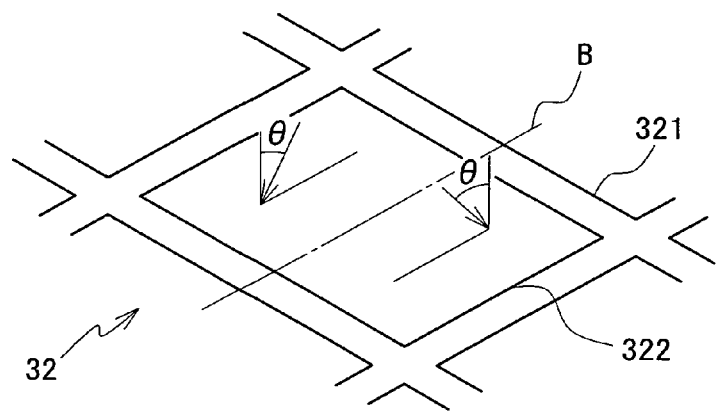
Figure 4C:
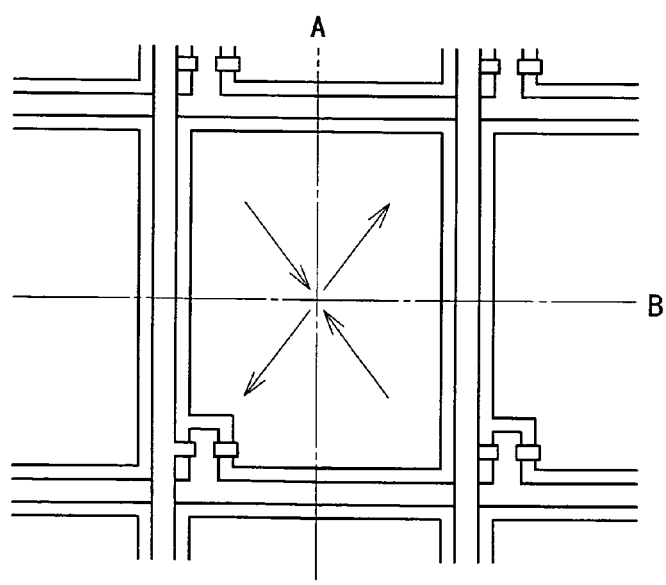
FIG. 4C illustrates alignment of liquid crystals in a pixel of a liquid crystal display panel formed by bonding the above substrates together.

FIGS. 4A and 4B are schematic views illustrating projection forms of light energy projected onto pixels which are arranged on each of a pair of substrates that form a liquid crystal display panel, namely, an array substrate and a color filter substrate. FIG. 4A illustrates a pixel arranged on the array substrate, while FIG. 4B illustrates a pixel arranged on the color filter substrate. FIG. 4C is a schematic plane view illustrating alignments of liquid crystals in a pixel of the liquid crystal display panel formed by bonding the above substrates together.

As illustrated in FIG. 4A, a pixel electrode 313 is arranged in a region surrounded by source bus lines 312 and gate bus lines 311, and a thin film transistor 313 which drives the pixel electrode 313 is arranged in the vicinity of an intersection of the source bus line 312 and the gate bus line 311 on the array substrate. In addition, on a surface of a pixel 31, an alignment layer made of polyamide or other material is arranged (not shown).

On the color filter substrate, as illustrated in FIG. 4B, a pixel 32 is defined by the black matrix 321, and a color filter layer 322 is arranged inside the pixel 32. In addition, a common electrode and an alignment layer are arranged on a surface of the pixel 32 (not shown).

As configurations and manufacturing methods of the array substrate and the color filter substrates, conventional configurations and manufacturing methods are applicable, and thus descriptions thereof are omitted herein.

As illustrated in FIG. 4A, a photoalignment process of the array substrate involves two regions in the pixel 31 formed by dividing the pixel 31 in two at its substantial center line between the source bus lines 312 arranged on the sides. Alternate long and short dashed lines A in FIG. 4A indicate the boundary of the regions. Ultraviolet light is projected from a direction inclined at a predetermined angle θ to the normal to the surface of the pixel 31 onto each of the regions of the alignment layer. The directions of the ultraviolet lights projected onto the regions are such that, given that the optical axes of the ultraviolet lights are projected onto the surface of the pixel 31, the projected axes are substantially parallel to the source bus line 312, and the directions of the projected axes are 180 degrees opposite to each other.

A photoalignment process of the color filter substrate involves two regions formed by dividing the pixel 32 in two at its substantial center line between the two sides of the black matrix which are parallel to the gate bus lines 311 of the array substrate when the color filter substrate is bonded together with the array substrate. Alternate long and short dashed lines B in FIG. 4B indicate the boundary of the regions. Ultraviolet light is projected from a direction inclined at a predetermined angle θ to the normal to the surface of the pixel 32 onto each of the regions of the alignment layer. The directions of the ultraviolet lights projected onto the regions are such that, given that the optical axes of the ultraviolet lights are projected onto the surface of the pixel 32, the projected axes are substantially parallel to the gate bus lines 311, and the directions of the projected axes are 180 degrees opposite to each other.

When the array substrate and the color filter substrate to which the photoalignment processes are applied are bonded together, the liquid crystals filled between the substrates are aligned according to the directions of the photoalignment processes applied to the regions of the substrates, that is, the directions of the projections of the ultraviolet lights. Arrows in FIG. 4C schematically illustrate alignments of the liquid crystals. In each pixel, four domain regions are formed which are different to each other in alignment directions of the liquid crystals.

Figure 5A:
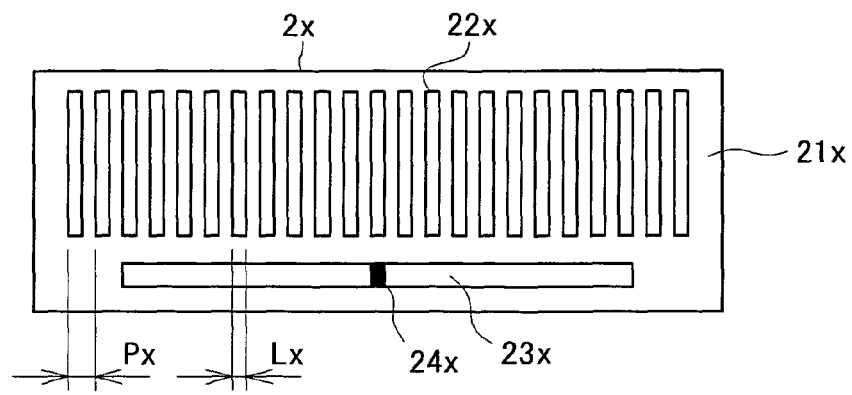
FIGS. 5A and 5B are views illustrating dimensional relation between a photomask for an array substrate used in the photoalignment process illustrated in FIGS. 4A and 4B and a pattern prearranged on the array substrate.
Figure 5B:
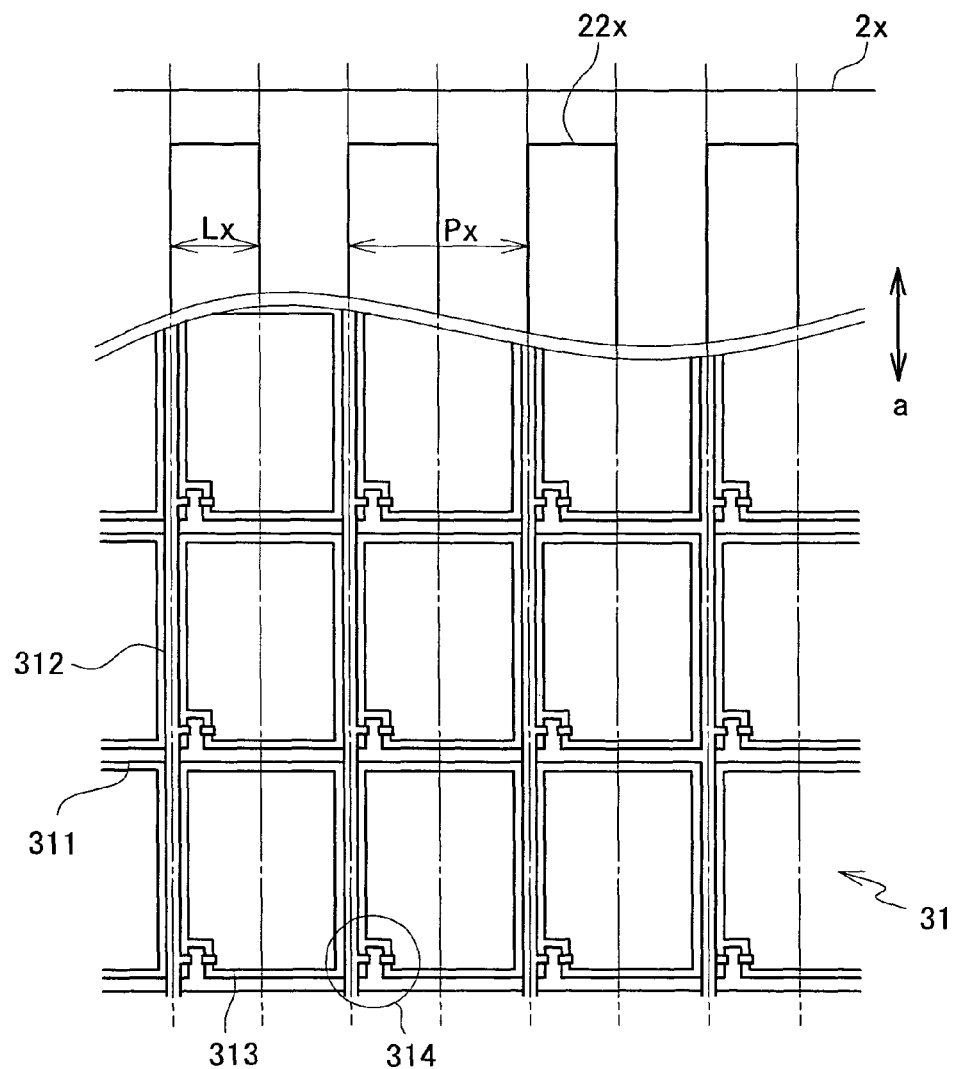

FIG. 5A is a view illustrating a configuration of a photomask used to apply the photoalignment process to the alignment layer of the array substrate in the implementation example (hereinafter referred to as an array substrate photomask). FIG. 5B is a schematic plane view illustrating relations in terms of dimensions and positions between the array substrate photomask and a pattern of pixels arranged on the array substrate.

Similar to the photomask 2 shown in FIG. 2, an array substrate photomask 2x is a plate member which has a substantially rectangle shape and is made of silica glass or other material. As illustrated in FIG. 5A, a plurality of light transmitting portions 22x capable of transmitting ultraviolet light are arranged substantially parallel to each other with a predetermined pitch. A pitch $P_x$ of the light transmitting portions 22 is set to be equal to a pitch of the source bus lines 312 arranged on the array substrate as illustrated in FIG. 5B. The width of the light transmitting portion 22x is set to be equal to about the half length of the pitch $P_x$. In addition, a light transmitting window 23x is arranged on the array substrate photomask 2x, and a reference mark 24x is arranged on the light transmitting window 23x. An arrow a in FIG. 5B indicates the moving direction of the array substrate with respect to the array substrate photomask 2x.

Using the array substrate photomask 2x, ultraviolet light is projected at a predetermined incident angle onto one of the two regions formed by dividing the pixel at its substantial centerline between the source bus lines 312. Then, ultraviolet light is projected onto the other region at a predetermined incident angle. The relation between the incident angles of the ultraviolet lights projected onto the regions are as described above. It is possible to project ultraviolet light onto each of the two regions using the single array substrate photomask 2x by shifting the position of the array substrate photomask 2x with respect to the array substrate by the half length of the pitch $P_x$ of the light transmitting portions in a direction perpendicular to the moving direction a of the array substrate.

Figure 6:
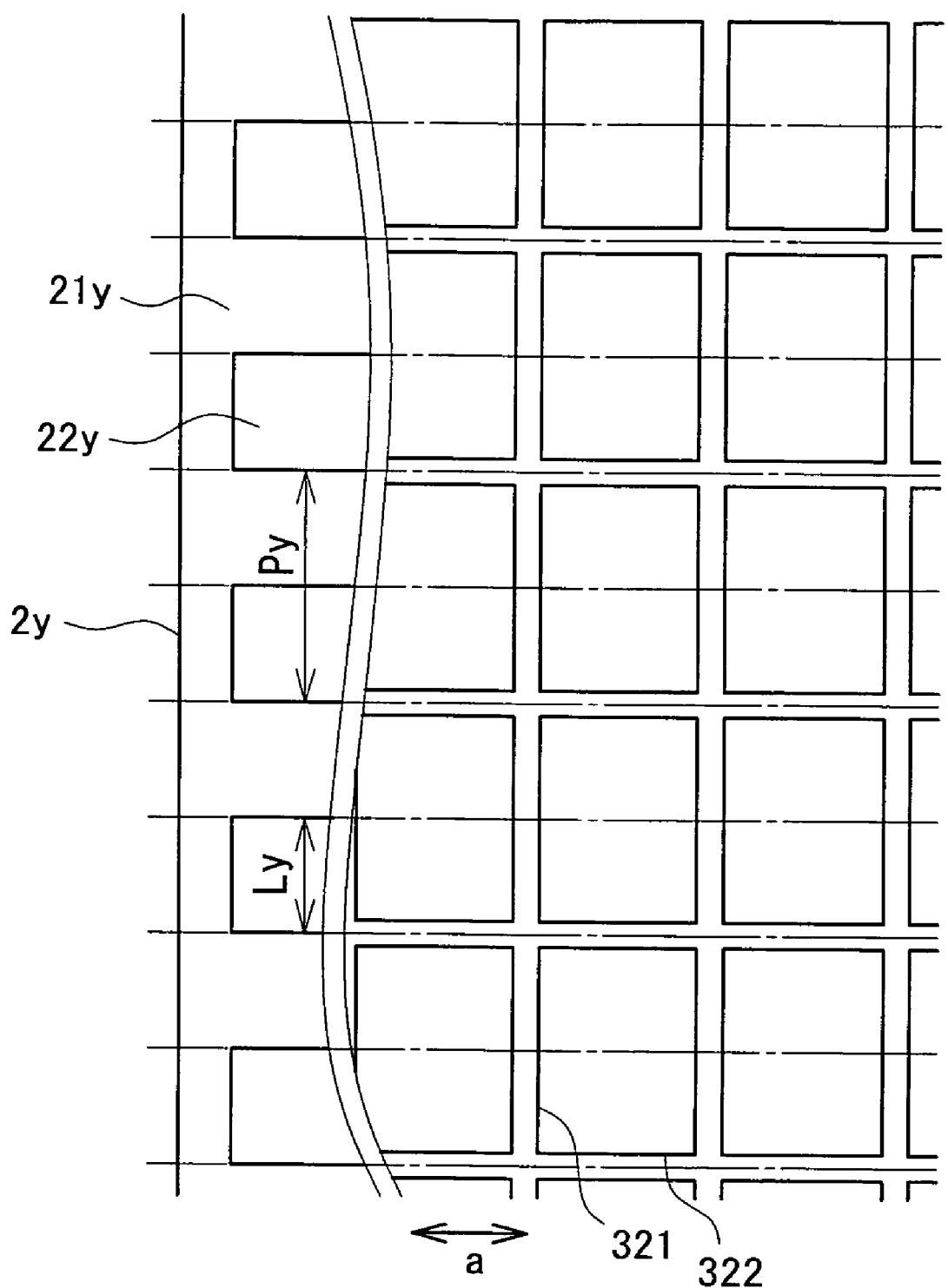
FIG. 6 is a view illustrating dimensional relation between a photomask for a color filter substrate used in the photoalignment process illustrated in FIGS. 4A and 4B and a pattern prearranged on the color filter substrate.

FIG. 6 is a schematic plane view illustrating relations in terms of dimensions and positions between a photomask used to apply a photoalignment process to the alignment layer arranged on the surface of the color filter substrate in the implementation example (hereinafter referred to as a color filter substrate photomask) and the pixels arranged on the color filter substrate.

The configuration of a color filter substrate photomask 2y is basically the same as that of the array substrate photomask 2x except for the dimensions of light transmitting portions 22y. As illustrated in FIG. 6, a pitch $P_y$ of the light transmitting portions 22y is set to be equal to the pitch of the sides of the black matrix 321 which are parallel to the gate bus lines of the array substrate. The width of the light transmitting portions 22y is set to be equal to about the half length of the pitch $P_y$. In addition, a light transmitting window (not shown) which is similar to the light transmitting window 23x of the array substrate photomask 2x is arranged on the color filter substrate photomask 2y, and a reference mark is arranged on the light transmitting window. An arrow a in FIG. 6 indicates the moving direction of the color filter substrate with respect to the color filter substrate photomask 2y.

Using the color filter substrate photomask 2y, ultraviolet light is projected at a predetermined incident angle onto one of the two regions formed by dividing the pixel at its substantial center line between the sides which are parallel to the gate bus lines of the array substrate. Then, ultraviolet light is projected onto the other region at a predetermined incident angle. The relation between the incident angles of the ultraviolet lights projected onto the regions is as described above. It is possible to project ultraviolet light onto each of the two regions using the single color filter substrate photomask 2y by shifting the position of the color filter substrate photomask 2y with respect to the color filter substrate by the half length of the pitch $P_y$ of the light transmitting portions 22y in a direction perpendicular to the moving direction a of the color filter substrate.

As described above, the present invention provides a method to perform exposure by projecting ultraviolet light or other light onto some regions on a surface of a substrate using a plurality of small photomasks having slit openings, while moving the substrate. By this method, it is possible to perform exposure with high alignment accuracy regardless of sizes of substrates.

In addition, while projecting ultraviolet light or other light and moving the substrate, the method simultaneously photographs an existing pattern prearranged on the substrate surface, such as a line pattern including a gate bus line, a source bus line, and a black matrix, and a reference mark of the photomask to monitor using a photographed image the position onto which the light is actually projected, in other words, monitor the position of the photomask with respect to the existing pattern on the substrate. The above procedures enable the exposure method according to the present invention to be performed with high accuracy.

The foregoing description of the preferred embodiments and the implementation example of the present invention has been presented for purposes of illustration and description with reference to the drawings. However, it is not intended to limit the present invention to the preferred embodiments, and modifications and variations are possible as long as they do not deviate from the principles of the present invention.

For example, the present invention is applied to a photo-alignment process of an alignment layer of a liquid crystal display panel in the descriptions above; however, it is not limited thereto. The present invention is applicable to exposure performed using photolithographic technique to provide color filter layers, a black matrix, and other certain constituents.

What is claimed is:

1. An exposure method to project ultraviolet light or other light onto an alignment layer on a substrate to form a plurality of regions having different alignment directions in each pixel of the substrate, wherein the light energy is projected onto the alignment layer through a photomask while moving the substrate, and alignment adjustment of the photomask is performed following an existing pattern which is prearranged on the substrate, by comparing the image of the existing pattern and the image of a reference mark arranged on the photomask.

2. The exposure method according to claim 1, wherein the reference mark is arranged on a front side of the photomask in a moving direction.

3. The exposure method according to claim 2, wherein the reference mark is arranged on a horizontally long slit defining a light transmitting window.

4. The exposure method according to claim 1, wherein the existing pattern is one selected from the group of a gate bus line, a source bus ling, and a black matrix.

5. The exposure method according to claim 1, wherein the ultraviolet light is projected from a direction inclined at a predetermined angle to the normal to the surface onto each of the regions of the alignment layer of the pixel.

6. The exposure device according to claim 5, wherein the directions of the projected axes onto each of the regions of the alignment layer of the pixel are 180 degrees opposite each other.

7. The exposure method according to claim 1, wherein the image recognition of the existing pattern prearranged on the substrate and the image recognition of the reference mark of the photomask are performed using one camera.

8. The exposure method according to claim 1, wherein the camera is a bifocal camera.

9. The exposure method according to claim 1, wherein on the photomask, vertically long slits defining the light transmitting members are arranged side by side with a predetermined pitch along a direction perpendicular to the moving direction of the substrate.

10. The exposure method according to claim 9, wherein a pitch of the light transmitting members is set to be equal to a pitch of the source bus lines arranged on the array substrate.

11. The exposure method according to claim 9, wherein a pitch of the light transmitting members is set to be equal to a pitch of the black matrix.

12. The exposure method according to claim 1, wherein the exposure process terminates when the existing pattern moves under the photomask from the starting edge to the ending edge.

* * * * *